(12) United States Patent
Hsu (10) Patent No.: US 11,089,420 B2
(45) Date of Patent: Aug. 10, 2021

(54) SPEECH PROCESSING SYSTEM AND SPEECH PROCESSING METHOD

(71) Applicant: Chicony Electronics Co., Ltd., New Taipei (TW)

(72) Inventor: Chih-Hsiang Hsu, New Taipei (TW)

(73) Assignee: Chicony Electronics Co., Ltd., New Taipei (TW)

( * ) Notice: Subject to any disclaimer, the term of this patent is extended or adjusted under 35 U.S.C. 154(b) by 109 days.

(21) Appl. No.: 16/531,138

(22) Filed: Aug. 5, 2019

(65) Prior Publication Data

US 2020/0314572 A1    Oct. 1, 2020

(30) Foreign Application Priority Data

Mar. 28, 2019    (TW) .................................. 108111049

(51) Int. Cl.

| G10L 21/0216 | (2013.01) |
|---|---|
| G10L 21/0316 | (2013.01) |
| H04R 3/00 | (2006.01) |
| H04R 29/00 | (2006.01) |
| H03F 3/183 | (2006.01) |
| H03G 3/30 | (2006.01) |
| H04R 1/08 | (2006.01) |

(52) U.S. Cl.
CPC .......... *H04R 29/005* (2013.01); *H03F 3/183* (2013.01); *H03G 3/3005* (2013.01); *H04R 1/08* (2013.01); *H04R 3/005* (2013.01); *H03F 2200/03* (2013.01)

(58) Field of Classification Search
CPC ............. G10L 21/0216; G10L 21/0232; G10L 2021/02165; G10L 21/0316; G10L 21/0272; G10L 2021/02166; H04R 2430/20; H04R 2430/25; H04R 29/005; H04R 3/005
USPC ......................................... 381/92, 56, 57, 58
See application file for complete search history.

(56) References Cited

U.S. PATENT DOCUMENTS

| 2014/0270202 A1 | 9/2014 | Ivanov et al. | |
|---|---|---|---|
| 2014/0270217 A1* | 9/2014 | Ivanov ................. | H04R 29/004 381/66 |
| 2016/0284349 A1 | 9/2016 | Ravindran et al. | |
| 2017/0243578 A1* | 8/2017 | Son ..................... | G10L 21/0232 |

* cited by examiner

*Primary Examiner* — Vivian C Chin
*Assistant Examiner* — Ubachukwu A Odunukwe
(74) *Attorney, Agent, or Firm* — CKC & Partners Co., LLC (57) ABSTRACT

Speech processing system includes a first sound receiving device, a second sound receiving device, a main controller, and an audio processor. First and second sound receiving devices are configured to generate a main voice signal or a secondary voice signal. A first sensing device in first sound receiving device and a second sensing device in second sound receiving device are configured to output a first sensing signal or a second sensing signal based on a sensing result. Main controller controls first sound receiving device to generate main voice signal and controls second sound receiving device to generate secondary voice signal when receiving first sensing signal. Main controller controls second sound receiving device to generate main voice signal and controls first sound receiving device to generate secondary voice signal when receiving second sensing signal. Audio processor is configured to process main and secondary voice signals into an output voice signal.

14 Claims, 6 Drawing Sheets

SPEECH PROCESSING SYSTEM AND SPEECH PROCESSING METHOD

RELATED APPLICATIONS

This application claims priority to Taiwan Application Serial Number 108111049, filed Mar. 28, 2019, which is herein incorporated by reference.

BACKGROUND

Field of Invention

The present disclosure relates to a speech processing system and a speech processing method. More particularly, the present disclosure relates to a speech processing system and a speech processing method capable of sensing a user to automatically turn on.

Description of Related Art

Main performances of a sound receiving device, such as frequency response, are determined by sound receiving units. The number of units may be one to several tens, and this number is determined by the sound receiving method and function of the sound receiving device. The common sound receiving system includes the sound receiving units plus the signal amplifier circuit. The sound receiving effect of a sound receiving device is mainly determined by the selection of electronic components and the modification of back-end software. However, under the same conditions, it is difficult to create differentiation.

For the foregoing reasons, there is a need to further improve the sound receiving effect of a sound receiving device, such as a microphone, by providing a new method.

SUMMARY

A speech processing system is provided. The speech processing system includes a first sound receiving device, a second sound receiving device, a main controller, and an audio processor. The first sound receiving device and the second sound receiving device are configured to receive a main voice signal or a secondary voice signal. A first sensing device in the first sound receiving device and a second sensing device in the second sound receiving device are configured to output a first sensing signal or a second sensing signal based on a sensing result. The main controller controls the first sound receiving device to generate the main voice signal and controls the second sound receiving device to generate the secondary voice signal when receiving the first sensing signal. The main controller controls the second sound receiving device to generate the main voice signal and controls the first sound receiving device to generate the secondary voice signal when receiving the second sensing signal. The audio processor is configured to process the main voice signal and the secondary voice signal into an output voice signal.

The present disclosure provides a speech processing method including the following operations: outputting a first sensing signal or a second sensing signal through a sensing result of a first sensing device or a second sensing device; receiving the first sensing signal or the second sensing signal through a main controller; controlling switching states of a first switch and a second switch to couple the first sound receiving device and the second sound receiving device to an audio processor; controlling the first sound receiving device to generate a main voice signal and controlling the second sound receiving device to generate a secondary voice signal when receiving the first sensing signal; controlling the second sound receiving device to generate the main voice signal and controlling the first sound receiving device to generate the secondary voice signal when receiving the second sensing signal; and processing the main voice signal and the secondary voice signal into an output voice signal through the audio processor.

In summary, the first sensing device or the second sensing device is used to detect whether the user approaches the first sound receiving device or the second sound receiving device. When the user approaches, the main controller turns on the corresponding first sound receiving device or second sound receiving device based on the position of the user. Subsequently, the audio processor is used to process the voice signals received by the first sound receiving device and the second sound receiving device into the output voice signal.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

It should be understood that the terms, "comprising", "including", "having" and the like, used herein are open-ended, that is, including but not limited to. It will be understood that, as used herein, the phrase "and/or" includes any and all combinations of one or more of the associated listed items.

In this document, the term "coupled" may also be termed "electrically coupled," and the term "connected" may be termed "electrically connected." "Coupled" and "connected" may also be used to indicate that two or more devices cooperate or interact with each other. It will be understood that, although the terms "first," "second," etc., may be used herein to describe various devices, they are merely used to distinguish the devices or operations described with the same technical terms. Unless otherwise specified, these terms do not refer to or imply the order or priority, nor are they intended to limit the present disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings. Wherever possible, the same reference numbers are used in the drawings and the description to refer to the same or like parts.

Figure 1:
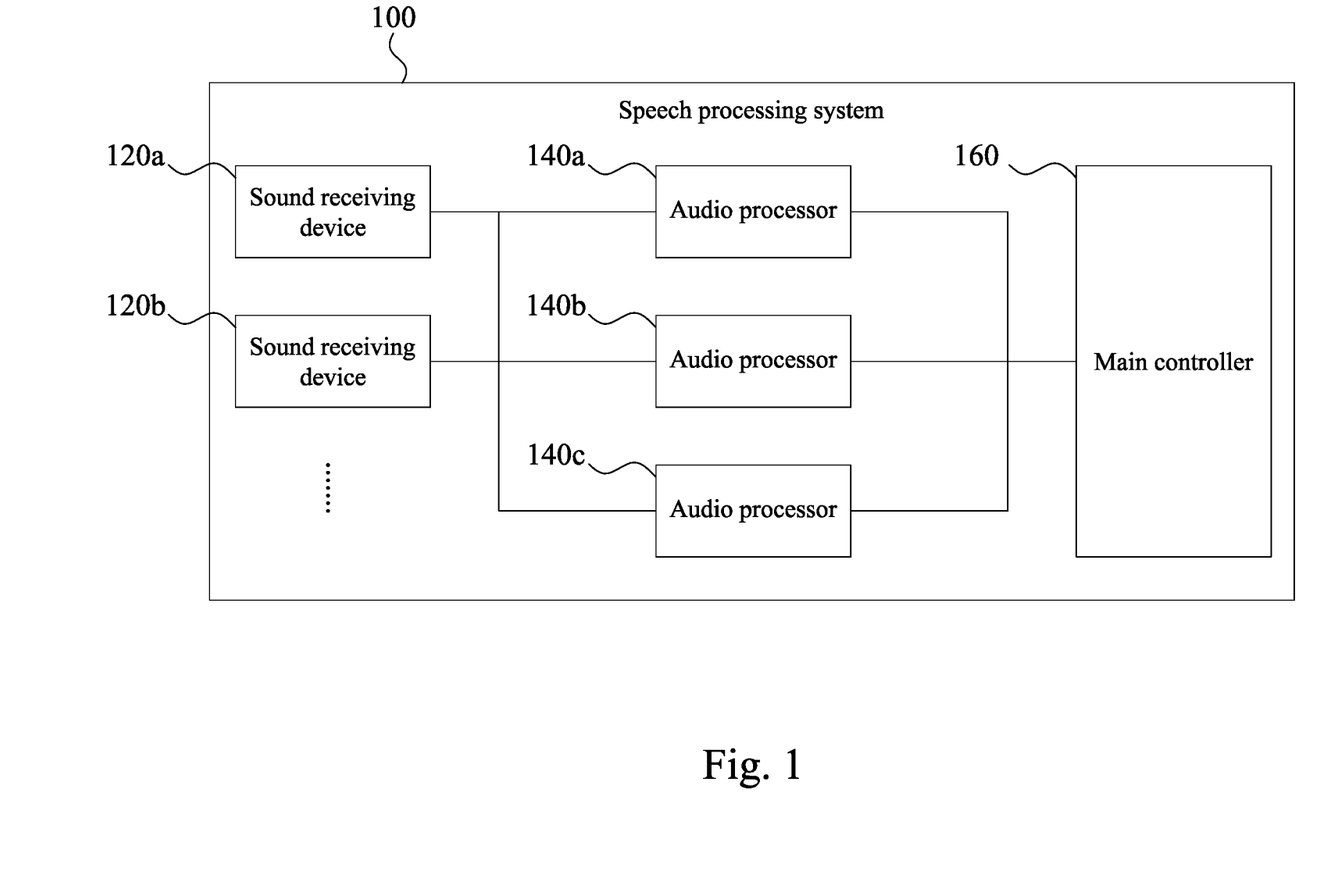
FIG. 1 depicts a simplified functional block diagram of a speech processing system according to one embodiment of the present disclosure.

A description is provided with reference to FIG. 1. FIG. 1 depicts a simplified functional block diagram of a speech processing system according to one embodiment of the present disclosure. A speech processing system 100 includes a plurality of sound receiving devices 120a, 120b, an audio processor 140a, an audio processor 140b, an audio processor 140c, and a main controller 160. The sound receiving device 120a and the sound receiving device 120b are communicatively connected to the audio processor 140a, the audio processor 140b, and the audio processor 140c. The audio processor 140a, the audio processor 140b, and the audio processor 140c are communicatively connected to the main controller 160. To simplify matters, only two sound receiving devices and three audio processors are depicted in FIG. 1, but the actual number of the sound receiving devices and the number of the audio processors are not limited to the above and may be adjusted depending on practical requirements.

In one embodiment, the speech processing system 100 may be a microphone array system. The sound receiving device 120a and the sound receiving device 120b are configured to receive sounds, such as voices, ambient sounds, and the like, to generate voice signals. Each of the sound receiving device 120a and the sound receiving device 120b may be a microphone or some other device having the function of receiving sounds to generate voice signals. The audio processor 140a, the audio processor 140b and the audio processor 140c are configured to process the voice signals that are generated through the sound receiving device 120a and the sound receiving device 120b. The main controller 160 is configured to receive a signal of a sensing device, and control the sound receiving device 120a and the sound receiving device 120b correspondingly based on a sensing result of the sensing device. The main controller 160 can also receive the voice signals processed by the audio processor 140a, the audio processor 140b and the audio processor 140c. Each of the main controller 160, the audio processor 140a, the audio processor 140b, and the audio processor 140c may be a central processing unit, a microprocessor, or some other device having data processing functions. Operation methods of the speech processing system 100 are illustrated as follows by way of examples.

Figure 2:
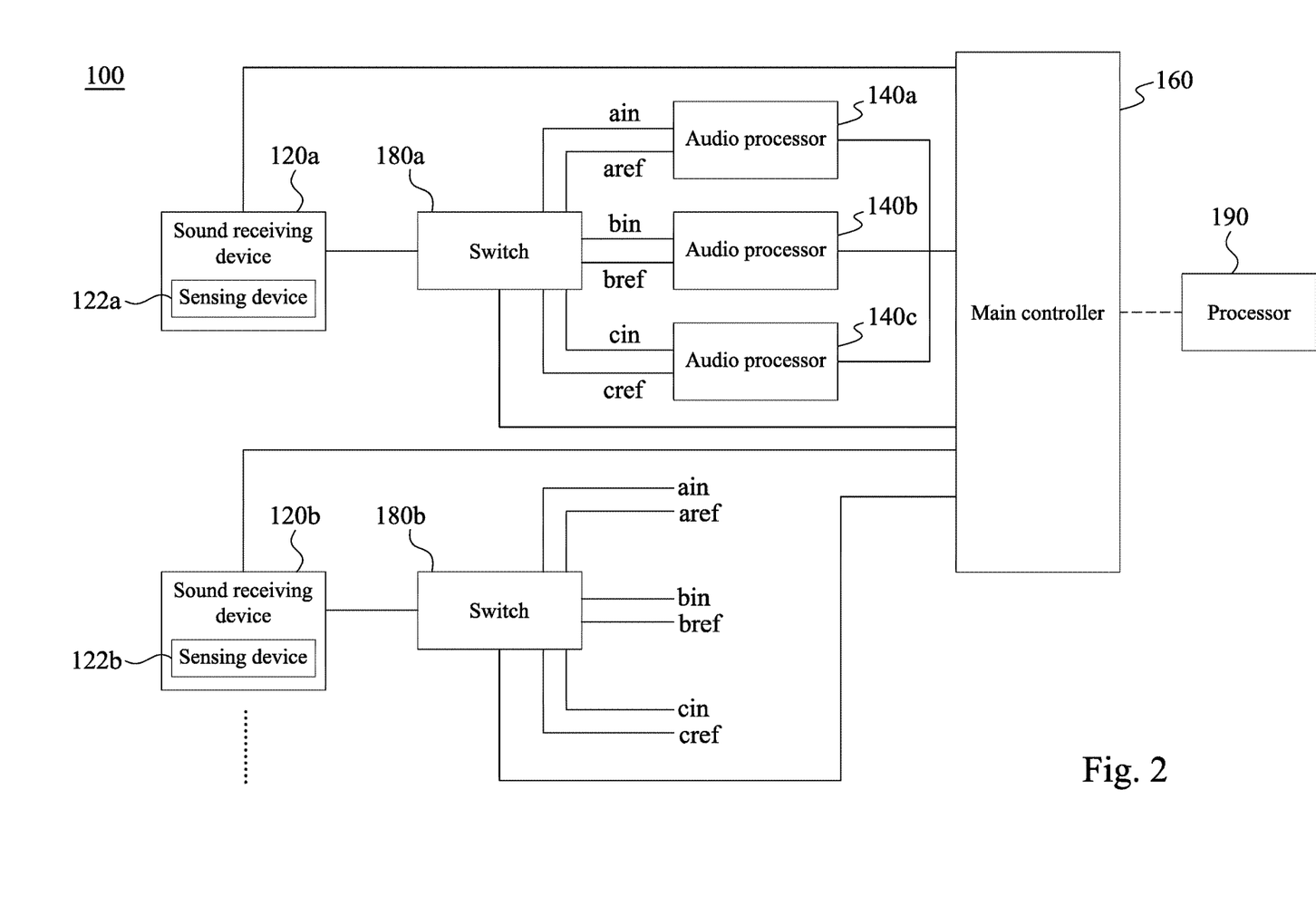
FIG. 2 depicts a functional block diagram of a speech processing system according to one embodiment of the present disclosure.
Figure 3:
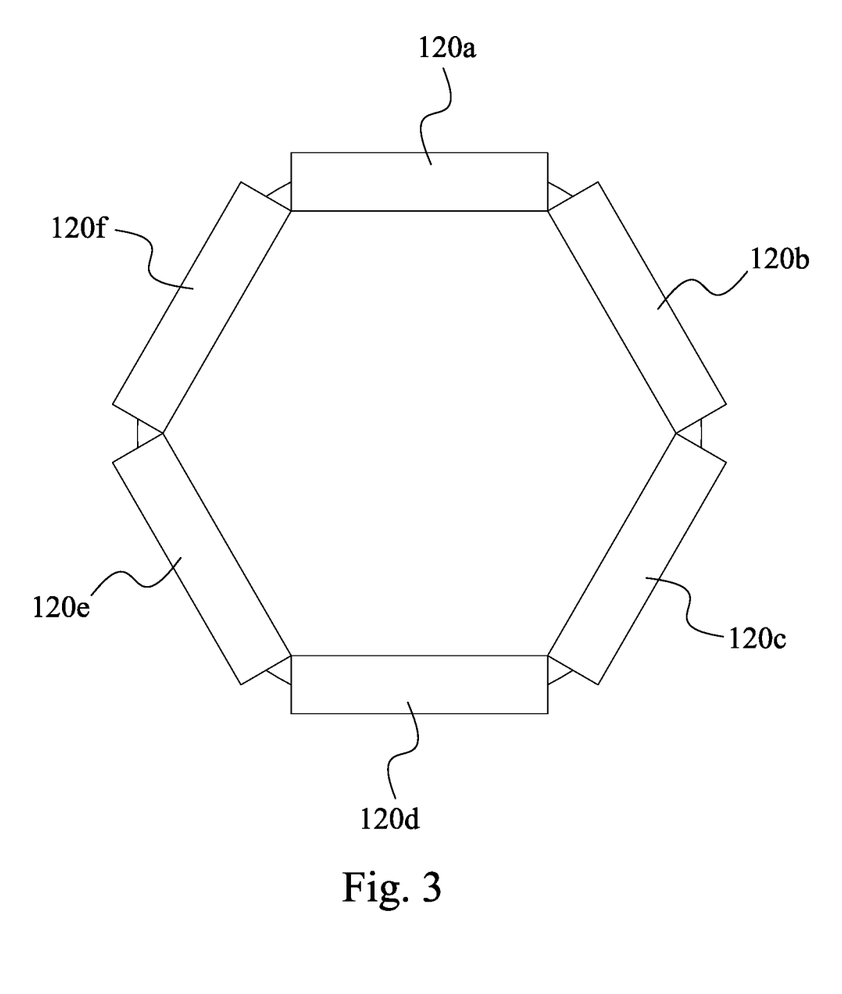
FIG. 3 depicts a schematic diagram of a configuration of a sound receiving device according to one embodiment of the present disclosure.

A description is provided with reference to FIG. 2 and FIG. 3. FIG. 2 depicts a functional block diagram of a speech processing system according to one embodiment of the present disclosure. FIG. 3 depicts a schematic diagram of a configuration of a sound receiving device according to one embodiment of the present disclosure. In the present embodiment, six sound receiving devices and three audio processors are taken as an example for illustration. The speech processing system 100 includes the sound receiving devices 120a-120b and sound receiving devices 120c-120f. The sound receiving devices 120a-120f include sensing devices 122a-122f respectively and are coupled to switches 180a-180f respectively. To simplify matters, only the sound receiving device 120a, the sound receiving device 120b, the sensing device 122a, the sensing device 122b, the switch 180a, and the switch 180b are depicted, as shown in FIG. 2. The sound receiving devices 120a-120f and the sensing devices 122a-122f are independent devices and have positional correspondences.

The sensing devices 122a-122f are configured to sense an object (such as a human body) or an environmental factor (such as temperature, distance, or sound volume). The speech processing system 100 determines whether a user approaches through the sensing devices 122a-122f disposed at different positions. When the user approaches, it might mean that the user may use one of the sound receiving devices 120a-120f to speak or record. Each of the sensing devices 122a-122f may be a temperature sensing device, a distance sensing device, a volume sensing device, or other devices having a sensing function, or combinations thereof.

Each of the switches 180a-180f is constituted by a plurality of transfer switches. The switches 180a-180f can be used to switch connections between the corresponding sound receiving devices 120a-120f and the audio processors 140a, 140b, 140c through a line ain, a line aref, a line bin, a line bref, a line cin, or a line cref. Not only does the main controller 160 control the sound receiving devices 120a-120f based on the sensing result of the sensing devices 122a-122f, but the main controller 160 can also control the corresponding switches 180a-180f to switch the connections between the sound receiving devices 120a-120f and the audio processors 140a, 140b, 140c based on the sensing result of the sensing devices.

Figure 4:
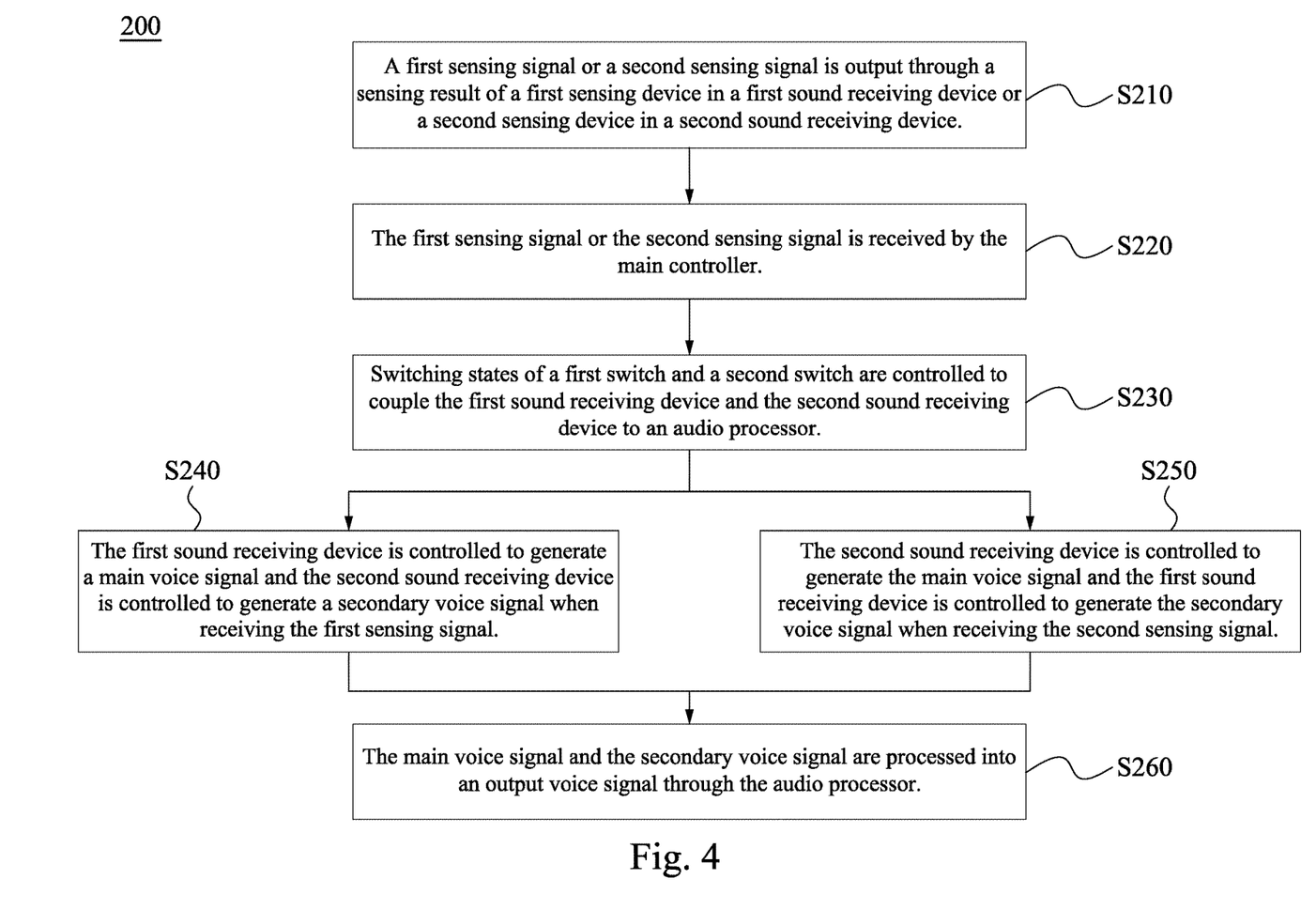
FIG. 4 depicts a flowchart of a speech processing method according to one embodiment of the present disclosure.

A description is provided with reference to FIG. 4. FIG. 4 depicts a flowchart of a speech processing method according to one embodiment of the present disclosure. In order to facilitate the understanding of the speech processing method shown in FIG. 4, the description is also provided with reference to FIG. 2 and FIG. 3. A method 200 includes step S210, step S220, step S230, step S240, step S250, and step S260. Those skilled in the art would understand that the speech processing method according to the embodiment of the present disclosure is not limited to being applied to the speech processing system 100 of FIG. 2 and FIG. 3, and is not limited to the sequence of steps of the flowchart shown in FIG. 4. In the present embodiment, an example for illustration is given to take the sound receiving device 120a as a first sound receiving device and the sound receiving device 120d as a second sound receiving device. The sound receiving device 120a and the sound receiving device 120d can generate a first voice signal and a second voice signal after receiving a sound. For example, when the user uses the sound receiving device 120a to start speaking, the sound receiving device 120a receives the voice spoken by the user, and generates the first voice signal, which serves as a main voice signal. At this time, the sound receiving device 120d receives the environmental sound and generates the second voice signal, which serves as a secondary voice signal. Alternatively, when the user uses the sound receiving device 120a to start speaking, the sound receiving device 120a can receive the voice spoken by the user and part of the environmental sound, and generates the first voice signal, which serves as the main voice signal. The sound receiving device 120d receives the environmental sound and part of the voice spoken by the user and generates the second voice signal, which serves as the secondary voice signal.

In the present embodiment, the sensing device 122a in the sound receiving device 120a is a first sensing device. A sensing device 122d in the sound receiving device 120d is a second sensing device. The switch 180a corresponding to the sound receiving device 120a is a first switch. The switch 180d corresponding to the sound receiving device 120d is a second switch. It is noted that the second sound receiving device is disposed opposite to the first sound receiving device. Therefore, the first sound receiving device and the second sound receiving device may be illustrated by taking the sound receiving device 120b and the sound receiving device 120e, or the sound receiving device 120c and the sound receiving device 120f as an example.

In step S210, a first sensing signal or a second sensing signal is output based on a sensing result of the sensing device 122a and the sensing device 122d.

In one embodiment, each of the sensing devices 122a-122f may be a temperature sensing device. The sensing result may be a temperature sensing result. For example, in the speech processing system 100, a reference temperature (such as 26 degrees Celsius) could be preset. When a temperature detected by the sensing device is higher than the reference temperature, it may indicate that the user is likely to approach the sensing device. The main controller 160 turns on the sound receiving device corresponding to the sensing device. For example, when the user approaches the sound receiving device 120a, at this time the sensing device 122a detects that the temperature rises and is higher than the preset reference temperature. The sensing device 122a transmits the first sensing signal to the main controller 160. Or, the reference temperature could be a reference temperature range, such as 26 to 40 degrees Celsius. When the user approaches the sound receiving device 120a, at this time the sensing device 122a detects that a body temperature of the user is within the preset reference temperature range. The sensing device 122a transmits the first sensing signal to the main controller 160.

In step S220, the first sensing signal or the second sensing signal is received by the main controller 160.

If the user is located in front of the sensing device 122a, in step S230, the main controller 160 controls switching states of the switch 180a (the first switch) and the switch 180d (the second switch) to allow the sound receiving device 120a (the first sound receiving device) and the sound receiving device 120d (the second sound receiving device) to be coupled to the audio processor. For example, when the main controller 160 receives the first sensing signal, the main controller 160 controls the switch 180a to allow the sound receiving device 120a corresponding to the switch 180a to be coupled to the audio processor 140a through the line ain. The main controller 160 also controls the switch 180d to allow the sound receiving device 120d corresponding to the switch 180d to be coupled to the audio processor 140a through the line aref. If the user is located in front of the sensing device 122d, the main controller 160 controls the switch 180a to allow the sound receiving device 120a corresponding to the switch 180a to be coupled to the audio processor 140a through the line aref when the main control 160 receives the second sensing signal. The main controller 160 also controls the switch 180d to allow the sound receiving device 120d corresponding to the switch 180d to be coupled to the audio processor 140a through the line ain.

When the main controller 160 receives the first sensing signal, step S240 is executed. The main controller 160 controls the sound receiving device 120a (the first sound receiving device) to generate the main voice signal, and controls the sound receiving device 120d (the second sound receiving device) to generate the secondary voice signal. For example, the main controller 160 controls the sound receiving device 120a (the first sound receiving device) to receive the sound so as to generate the first voice signal, uses the first voice signal generated by the sound receiving device 120a as the main voice signal, and allows the generated first voice signal (the main voice signal) to be transmitted to the audio processor 140a through the switch 180a and the line ain. At the same time, the main controller 160 correspondingly controls the sound receiving device 120d (the second sound receiving device) to receive the sound so as to generate the second voice signal, uses the second voice signal generated by the sound receiving device 120d as the secondary voice signal, and allows the generated second voice signal (the secondary voice signal) to be transmitted to the audio processor 140a through the switch 180d and the line aref.

When the main controller 160 receives the second sensing signal, step S250 is executed. The main controller 160 controls the sound receiving device 120d (the second sound receiving device) to generate the main voice signal, and controls the sound receiving device 120a (the first sound receiving device) to generate the secondary voice signal. For example, the main controller 160 controls the sound receiving device 120d (the second sound receiving device) to receive the sound so as to generate the second voice signal, uses the second voice signal generated by the sound receiving device 120d as the main voice signal, and allows the generated second voice signal (the main voice signal) to be transmitted to the audio processor 140a through the switch 180d and the line ain. At the same time, the main controller 160 correspondingly controls the sound receiving device 120a (the first sound receiving device) to receive the sound so as to generate the first voice signal, uses the first voice signal generated by the sound receiving device 120a as the secondary voice signal, and allows the generated first voice signal (the secondary voice signal) to be transmitted to the audio processor 140a through the switch 180a and the line aref.

In step S260, the main voice signal and the secondary voice signal are processed into an output voice signal through the audio processors 140a-140c.

To simplify matters, only two switches 180a and 180b are depicted, as shown in FIG. 2. Each of the switches 180a-180f is constituted by the plurality of transfer switches, and the signals are one-in-one-out signals. The main controller 160 is used to switch corresponding sound receiving devices 120 to suitable lines, such as the line ain, the line aref, the lin bin, the line bref, the line cin, or the line cref. For example, when the sound receiving device 120a receives the main voice signal and the sound receiving device 120d receives the secondary voice signal, the main controller 160 switches the switch 180a to the line ain and switches the switch 180d to the line aref. The audio processor 140a receives the main voice signal of the line ain and the secondary voice signal of the line aref. In addition, the audio processor 140a processes the main voice signal and the secondary voice signal into the output voice signal, and outputs the output voice signal to the main controller 160. Processing the main voice signal and the secondary voice signal into the output voice signal mentioned above, for example, could be that the main voice signal and the secondary voice signal can be processed by the environmental noise cancellation (ENC) technology to remove various environmental interference noises in the main voice signal, such as speech of other people, noises generated by vehicles, wind noises, and the like, through subtracting the secondary voice signal from the main voice signal so as to obtain the output voice signal.

Figure 5:
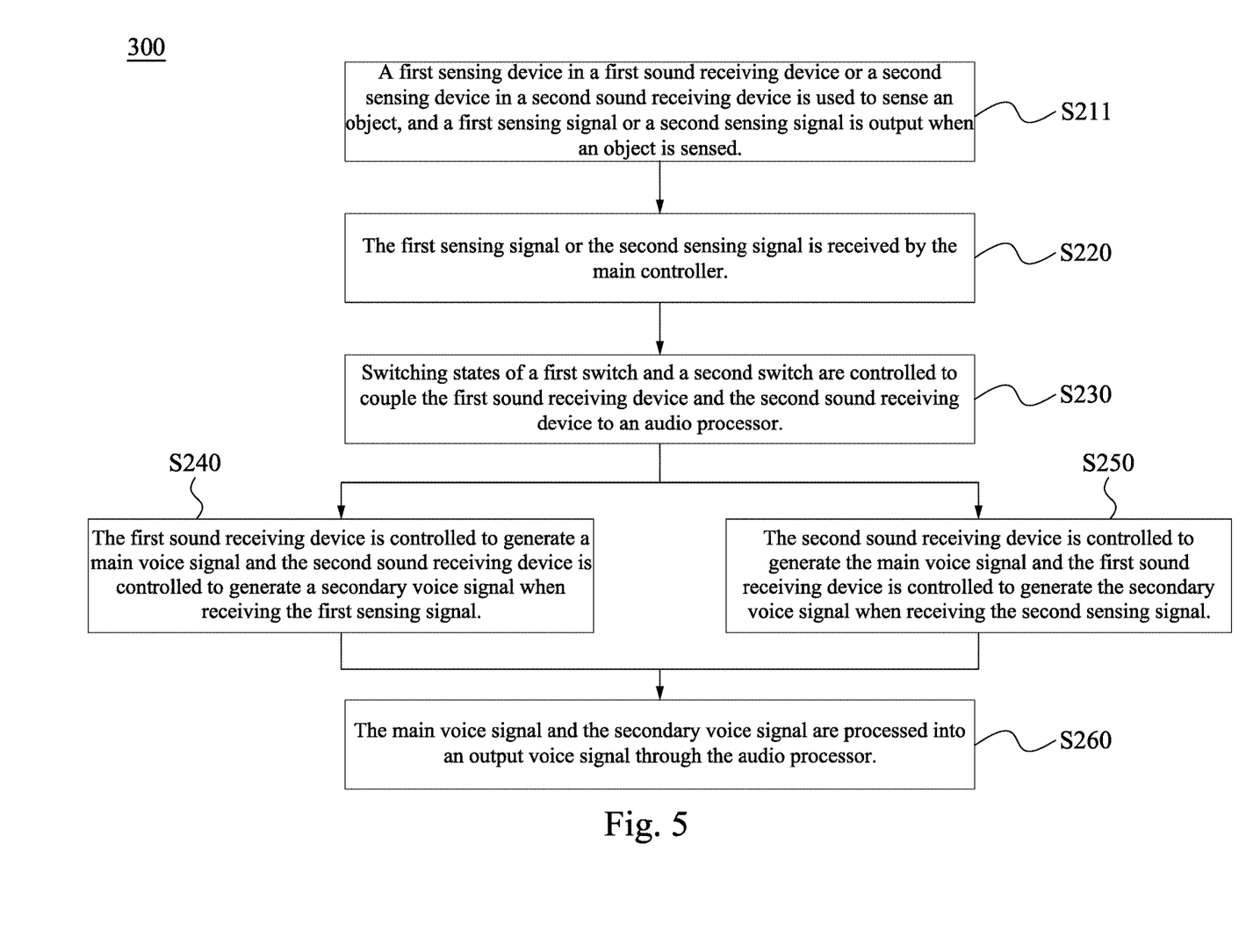
FIG. 5 depicts a flowchart of a speech processing method according to another embodiment of the present disclosure.

A description is provided with reference to FIG. 5. FIG. 5 depicts a flowchart of a speech processing method according to another embodiment of the present disclosure. In order to facilitate the understanding of the speech processing method shown in FIG. 5, the description is also provided with reference to FIG. 2 and FIG. 3. Those skilled in the art would understand that the speech processing method according to the present embodiment is not limited to being applied to the speech processing system 100 of FIG. 2 and FIG. 3, and is not limited to the sequence of steps of the flowchart shown in FIG. 5. A method 300 includes step S211, step S220, step S230, step S240, step S250, and step s260.

In step S211, a sensing result of the sensing device 122a in the sound receiving device 120a and the sensing device 122d in the sound receiving device 120d is a result of sensing whether an object approaches. When a user approaches the sound receiving device 120a, the sensing device 122a in the sound receiving device 120a senses that an object approaches, and outputs the first sensing signal. Similarly, when the user approaches the sound receiving device 120d, the sensing device 122d in the sound receiving device 120d senses that the object approaches, and outputs the second sensing signal. If the sensing device 122a and the sensing device 122d do not sense any object, the sensing is continued. Since step S220 to step S260 are the same as those described in FIG. 4, a description in this regard is not provided.

In one embodiment, the speech processing system 100 includes a processor 190. After the main controller 160 receives the output voice signal, the output voice signal can be transmitted to the processor 190. The processor 190 can receive a plurality of output voice signals processed by the audio processor 140a, the audio processor 140b, and the audio processor 140c, and perform subsequent processes. The processor 190 may be a computer or a mobile phone, and is connected to the main controller 160 through Universal Serial Bus (USB) or Bluetooth, but the disclosure is not limited in this regard.

For example, three users A, B, and C simultaneously use the speech processing system 100, and are located in front of different sensing devices. The user A is located in front of the sensing device 122a. The user B is located in front of the sensing device 122b. The user C is located in front of the sensing device 122c. A voice signal of the user A can be received and processed by the sound receiving devices 120a, 120d and the audio processor 140a. A voice signal of the user B can be received and processed by the sound receiving devices 120b, 120e and the audio processor 140b. A voice signal of the user C can be received and processed by the sound receiving devices 120c, 120f and the audio processor 140c. The speech processing system 100 uses the three audio processors 140a, 140b, and 140c to process the voice signals of the three users A, B and C and the results are output to the main controller 160. The main controller 160 can simultaneously receive output voice signals of the three audio processors and transport the output voice signals on channel 1, channel 2, and channel 3 respectively. When it is necessary to switch or select different channels, the main controller 160 or the processor 190 can perform switching or selection through internal switches (not illustrated in the figures).

In the present embodiment, the main controller 160 may be connected to a computer through, for example, USB or wireless communication. The computer can simultaneously process the voice signals of the users A, B, and C, and can further display the voice signals of the users A, B, and C respectively on the channel 1, the channel 2, and the channel 3 through a software on the computer. If a fourth user D wants to talk to the user A through a software of a mobile phone or a computer, the user D can select the appropriate channel by using the software to talk to the user A. If the voice signal of the user A is on the channel 1, the user D can select, by using the software, to only play the voice signal on the channel 1. The main controller 160 or the processor 190 can switch to the channel 1 through the internal switch and output the voice signal of the channel 1 to avoid interferences from other channels. In addition, the main controller 160 or the processor 190 can further turn off the unselected channels 2 and 3 according to the user's operation to avoid interferences from other channels that are not selected.

In one embodiment, each of the sound receiving devices 120a-120f includes an amplifier respectively (not illustrated in the figures). The amplifiers are configured to enhance or attenuate the voice signals generated by the sound receiving devices 120a-120f according to a magnification. In the embodiment, the sensing devices 122a and 122d in the sound receiving device 120a and the sound receiving device 120d include distance sensing devices. The distance sensing devices are configured to sense distances of an object (such as a human body) that approaches the sound receiving device 120a and the sound receiving device 120d from the distance sensing devices, i.e. an object distance. When an object distance between the object and the distance sensing device is less than a reference distance, it means that the user is closer to the sound receiving device 120a or 120d. The sensing device 122a or 122d corresponding to the sound receiving device 120a or 120d transmits a lowering signal to the main controller 160 to lower the magnification of the amplifier in the corresponding sound receiving device 120a or sound receiving device 120d so as to reduce the volume of sound received. When the object distance between the object and the distance sensing device is greater than a reference distance, it means that the user is farther away from the sound receiving device 120a or 120d. The sensing device 122a or 122d corresponding to the sound receiving device 120a or 120d transmits an enhancing signal to the main controller 160 to enhance the magnification of the amplifier in the corresponding sound receiving device 120a or sound receiving device 120d so as to increase the volume of sound received.

In one embodiment, the sensing devices 122a and 122d in the sound receiving device 120a and the sound receiving device 120d include volume sensing devices. The volume sensing devices are configured to sense voice volumes. When the voice volume is higher than a reference volume, it means that the user is closer to the sound receiving device 120a or 120d. The sensing device 122a or 122d corresponding to the sound receiving device 120a or 120d transmits the lowering signal to the main controller 160 to lower the magnification of the amplifier in the corresponding sound receiving device 120a or sound receiving device 120d so as to reduce the volume of sound received. When the voice volume is lower than the reference volume, it means that the user is farther away from the sound receiving device 120a or 120d. The sensing device 122a or 122d corresponding to the sound receiving device 120a or 120d transmits the enhancing signal to the main controller 160 to enhance the magnification of the amplifier in the corresponding sound receiving device 120a or sound receiving device 120d so as to increase the volume of sound received.

Figure 6:
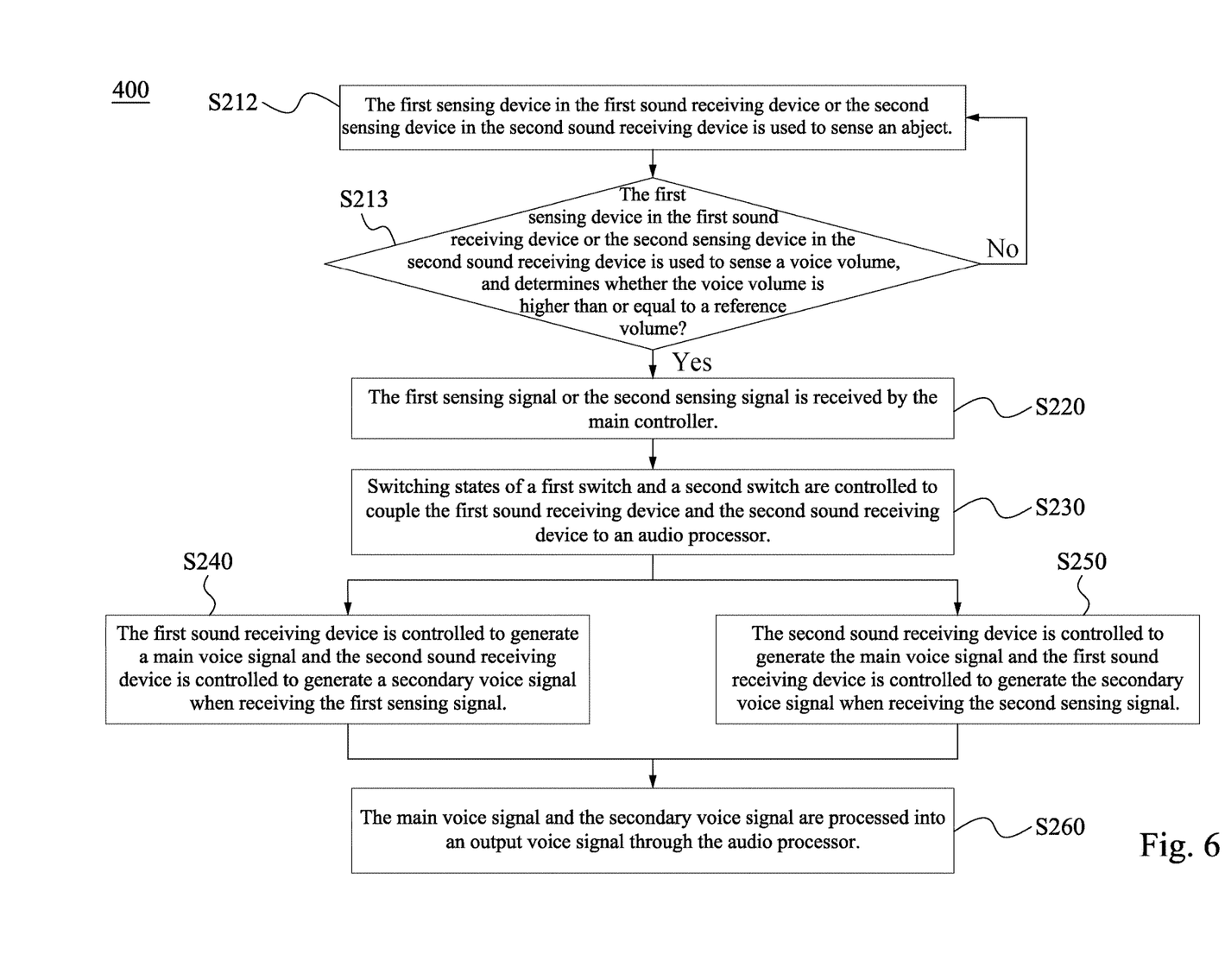
FIG. 6 depicts a flowchart of a speech processing method according to still another embodiment of the present disclosure.

The sensing devices 122a-122f can set different sensing methods depending on practical requirements. For example, the sensing devices 122a-122f can be set to send the sensing signals after sensing the proximity of the object and the sound. A description is provided with reference to FIG. 6. FIG. 6 depicts a flowchart of a speech processing method according to still another embodiment of the present disclosure. In order to facilitate the understanding of the speech processing method shown in FIG. 6, the description is also provided with reference to FIG. 2 and FIG. 3. Those skilled in the art would understand that the speech processing method according to the present embodiment is not limited to being applied to the speech processing system 100 of FIG. 2 and FIG. 3, and is not limited to the sequence of steps of the flowchart shown in FIG. 6.

A method 400 includes step S212, step S213, step S220, step S230, step S240, step S250, and step S260. In step S212, if the user is located in front of the sensing device 122a, the sensing device 122a senses that the user (object) approaches. At this time, the first sensing signal is not sent yet. The method of sensing that the user (object) approaches may be, for example, the above temperature sensing method or distance sensing method, etc., but the present disclosure is not limited in this regard. After the object is sensed, step S213 is executed. When the user starts speaking, the sensing device 122a senses the voice volume and determines whether it is higher than or equal to a reference volume. The reference volume may be set to 60 decibels that is the general human speaking volume, and the first sensing signal is sent to the main controller 160 when the voice volume is higher than or equal to the reference volume. Since step S220 to step S260 are the same as those described in FIG. 4, a description in this regard is not provided. On occasions where the number of users is large, the method of setting double conditions according to the present embodiment can be utilized to improve the accuracy of judgment.

A number of the sound receiving devices in the speech processing system 100 may be adjusted depending on practical applications, and a number of the audio processors may also be adjusted depending on the number of the sound receiving devices. In the embodiments of the present disclosure, the six sound receiving devices 120a-120f are taken as an example so the three audio processors 140a-140c are correspondingly disposed. In other words, the speech processing system 100 can process three sets of voice signals.

In summary, the speech processing system uses the respective sensing devices of the sound receiving devices to determine whether the user approaches or whether the user wants to use the sound receiving device. When the sound receiving devices are turned on, the sensing devices sense the distances or volumes of the user so that the volume of sound received can be automatically adjusted. The audio processor processes the main voice signal and the secondary voice signal into the output voice signal. The user can select the desired output voice signal depending on practical use conditions.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A speech processing system, comprising:
   a first sound receiving device configured to generate a first voice signal, wherein the first sound receiving device comprises:
      a first sensing device configured to output a first sensing signal in condition that a user approaches the first sound receiving device;
   a second sound receiving device disposed corresponding to the first sound receiving device and configured to generate a second voice signal, wherein the second sound receiving device comprises:
      a second sensing device configured to output a second sensing signal in condition that the user approaches the second sound receiving device;
   a main controller using the first voice signal as a main voice signal and using the second voice signal as a secondary voice signal when receiving the first sensing signal;
   the main controller using the second voice signal as the main voice signal and using the first voice signal as the secondary voice signal when receiving the second sensing signal; and
   an audio processor configured to process the main voice signal and the secondary voice signal into an output voice signal;
   wherein each of the first sound receiving device and the second sound receiving device further comprises:
      an amplifier configured to enhance or attenuate the first voice signal or the second voice signal according to a magnification;
   wherein when a first object distance sensed by the first sensing device is less than a reference distance, the first sensing device transmits a first lowering signal to the main controller to lower the magnification of the amplifier in the first sound receiving device, and when the first object distance is larger than the reference distance, the first sensing device transmits a first enhancing signal to the main controller to enhance the magnification of the amplifier in the first sound receiving device; and
   wherein when a second object distance sensed by the second sensing device is less than the reference distance, the second sensing device transmits a second lowering signal to the main controller to lower the magnification of the amplifier in the second sound receiving device, and when the second object distance is larger than the reference distance, the second sensing device transmits a second enhancing signal to the main controller to enhance the magnification of the amplifier in the second sound receiving device.

2. The speech processing system of claim 1, wherein when a first temperature sensed by the first sensing device is higher than a reference temperature, the first sensing device outputs the first sensing signal to the main controller so as to control the first sound receiving device to generate the main voice signal and control the second sound receiving device to generate the secondary voice signal, and when a second temperature sensed by the second sensing device is higher than the reference temperature, the second sensing device outputs the second sensing signal to the main controller so as to control the second sound receiving device to generate the main voice signal and control the first sound receiving device to generate the secondary voice signal.

3. The speech processing system of claim 1, wherein when a first voice volume sensed by the first sensing device is higher than a reference volume, the first sensing device transmits the first lowering signal to the main controller to lower the magnification of the amplifier in the first sound receiving device, and when the first voice volume sensed by the first sensing device is lower than the reference volume, the first sensing device transmits the first enhancing signal to the main controller to enhance the magnification of the amplifier in the first sound receiving device; and wherein when a second voice volume sensed by the second sensing device is higher than the reference volume, the second sensing device transmits the second lowering signal to the main controller to lower the magnification of the amplifier in the second sound receiving device, and when the second voice volume sensed by the second sensing device is lower than the reference volume, the second sensing device transmits the second enhancing signal to the main controller to enhance the magnification of the amplifier in the second sound receiving device.

4. The speech processing system of claim 1, further comprising:

a first switch; and a second switch;

wherein when the main controller receives the first sensing signal, the main controller switches the first switch to use the first voice signal as the main voice signal and switches the second switch to use the second voice signal as the secondary voice signal, and when the main controller receives the second sensing signal, the main controller switches the first switch to use the first voice signal as the secondary voice signal and switches the second switch to use the second voice signal as the main voice signal.

5. The speech processing system of claim 1, further comprising:

a processor configured to receive the output voice signal from one of a plurality of channels, wherein when the processor selects one of the channels, unselected channels other than the one of the channels are turned off.

6. The speech processing system of claim 1, wherein the second sound receiving device is disposed opposite to the first sound receiving device.

7. The speech processing system of claim 1, wherein the audio processor is further configured to obtain the output voice signal through subtracting the secondary voice signal from the main voice signal.

8. A speech processing method, comprising:

outputting a first sensing signal to a main controller in condition that a user approaches a first sensing device in a first sound receiving device;

outputting a second sensing signal to the main controller in condition that the user approaches a second sensing device in a second sound receiving device;

controlling switching states of a first switch and a second switch to couple the first sound receiving device and the second sound receiving device to an audio processor;

controlling the first sound receiving device to generate a main voice signal and controlling the second sound receiving device to generate a secondary voice signal when receiving the first sensing signal;

controlling the second sound receiving device to generate the main voice signal and controlling the first sound receiving device to generate the secondary voice signal when receiving the second sensing signal; and processing the main voice signal and the secondary voice signal into an output voice signal through the audio processor;

enhancing or attenuating the main voice signal or the secondary voice signal generated by the first sound receiving device or the second sound receiving device through an amplifier;

wherein when a first object distance sensed by the first sensing device is less than a reference distance, transmitting, by the first sensing device, a first lowering signal to the main controller, and when the first object distance sensed by the first sensing device is greater than the reference distance, transmitting, by the first sensing device, a first enhancing signal to the main controller;

wherein when a second object distance sensed by the second sensing device is less than the reference distance, transmitting, by the second sensing device, a second lowering signal to the main controller, and when the second object distance sensed by the second sensing device is greater than the reference distance, transmitting, by the second sensing device, a second enhancing signal to the main controller.

9. The speech processing method of claim 8, wherein when a first temperature sensed by the first sensing device is higher than a reference temperature, the first sensing device outputs the first sensing signal to the main controller so as to control the first sound receiving device to generate the main voice signal and control the second sound receiving device to generate the secondary voice signal, and when a second temperature sensed by the second sensing device is higher than the reference temperature, the second sensing device outputs the second sensing signal to the main controller so as to control the second sound receiving device to generate the main voice signal and control the first sound receiving device to generate the secondary voice signal.

10. The speech processing method of claim 9, wherein when the first temperature sensed by the first sensing device is higher than the reference temperature and a voice volume sensed by the first sensing device is higher than or equal to a reference volume, the first sensing device outputs the first sensing signal to the main controller so as to control the first sound receiving device to generate the main voice signal and control the second sound receiving device to generate the secondary voice signal, and when the second temperature sensed by the second sensing device is higher than the reference temperature and the voice volume sensed by the second sensing device is higher than or equal to the reference volume, the second sensing device outputs the second sensing signal to the main controller so as to control the second sound receiving device to generate the main voice signal and control the first sound receiving device to generate the secondary voice signal.

11. The speech processing method of claim 8, wherein when a first voice volume sensed by the first sensing device is higher than a reference volume, transmitting, by the first sensing device, the first lowering signal to the main controller, and when the first voice volume sensed by the first sensing device is lower than the reference volume, transmitting, by the first sensing device, the first enhancing signal to the main controller;

wherein when a second voice volume sensed by the second sensing device is higher than the reference volume, transmitting, by the second sensing device, the second lowering signal to the main controller, and when the second voice volume sensed by the second sensing device is lower than the reference volume, transmitting, by the second sensing device, the second enhancing signal to the main controller.

12. The speech processing method of claim 8, wherein the step of controlling the first sound receiving device to generate the main voice signal and controlling the second sound receiving device to generate the secondary voice signal when receiving the first sensing signal comprises:

switching the first switch to use a first voice signal generated by the first sound receiving device as the main voice signal, and switching the second switch to use a second voice signal generated by the second sound receiving device as the secondary voice signal through the first switch and the second switch.

13. The speech processing method of claim 12, wherein the step of controlling the second sound receiving device to generate the main voice signal and controlling the first sound receiving device to generate the secondary voice signal when receiving the second sensing signal further comprises:

switching the first switch to use the first voice signal as the secondary voice signal, and switching the second switch to use the second voice signal as the main voice signal through the first switch and the second switch.

14. The speech processing method of claim 8, further comprising:

receiving the output voice signal from one of a plurality of channels through a processor, wherein when the processor selects one of the channels, unselected channels other than the one of the channels are turned off.

\* \* \* \* \*